United States Patent
Wongratanaporngoorn et al.

(10) Patent No.: US 10,607,861 B2
(45) Date of Patent: Mar. 31, 2020

(54) DIE SEPARATION USING ADHESIVE-LAYER LASER SCRIBING

(71) Applicant: NXP B.V., Eindhoven (NL)

(72) Inventors: Siriluck Wongratanaporngoorn, Nonthaburi (TH); Yao Jung Chang, Kaohsiung (TW); Ekapong Tangpattanasaeree, Bangkok (TH); Paradee Jitrungruang, Bangkok (TH); Pitak Seantumpol, Pathumthani (TH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/825,079

(22) Filed: Nov. 28, 2017

(65) Prior Publication Data

US 2019/0164784 A1    May 30, 2019

(51) Int. Cl.
| | |
|---|---|
| *H01L 21/56* | (2006.01) |
| *H01L 21/768* | (2006.01) |
| *H01L 21/683* | (2006.01) |
| *H01L 21/67* | (2006.01) |
| *H01L 21/78* | (2006.01) |
| *B23K 26/00* | (2014.01) |

(52) U.S. Cl.
CPC .......... *H01L 21/568* (2013.01); *B23K 26/00* (2013.01); *H01L 21/67092* (2013.01); *H01L 21/67288* (2013.01); *H01L 21/6836* (2013.01); *H01L 21/76865* (2013.01); *H01L 21/78* (2013.01); *H01L 2221/68327* (2013.01); *H01L 2221/68336* (2013.01)

(58) Field of Classification Search
None
See application file for complete search history.

(56) References Cited

U.S. PATENT DOCUMENTS

| | | | |
|---|---|---|---|
| 6,674,154 B2 | 1/2004 | Minamio et al. | |
| 7,915,140 B2 | 3/2011 | Genda et al. | |
| 7,989,320 B2 | 8/2011 | Boyle et al. | |
| 8,058,103 B2* | 11/2011 | Fukumitsu | ......... B23K 26/0884 438/110 |
| 8,551,817 B2* | 10/2013 | Fukumitsu | ......... B23K 26/0884 438/110 |
| 8,800,475 B2 | 8/2014 | Finn | |
| 9,321,626 B2* | 4/2016 | Shaw | ...................... H01L 29/84 |

(Continued)

FOREIGN PATENT DOCUMENTS

CN     105215556 A     9/2015

*Primary Examiner* — David E Graybill

(57) ABSTRACT

A method for wafer dicing and removing separated integrated circuit (IC) dies from a carrier substrate includes mounting a wafer on a substrate using an adhesive layer, laser scribing the adhesive layer to create defect regions in the adhesive layer, and performing a breaking step to separate the laser-scribed adhesive layer into separated adhesive portions corresponding to the IC dies. For a stealth-dicing (SD) technique, defect regions also are created in the wafer using a laser and the breaking step is an expansion step that simultaneously separates the dies and corresponding portions of adhesive. For a dice-before-grind (DBG) technique, the dies are separated by backside grinding before the breaking step. Efficient adhesive-layer separation is achieved with reduced backside chipping associated with conventional blade dicing.

13 Claims, 2 Drawing Sheets

(56) References Cited

U.S. PATENT DOCUMENTS

| | | | |
|---|---|---|---|
| 2007/0057378 A1* | 3/2007 | Arai | H01L 21/6835 |
| | | | 257/777 |
| 2007/0085099 A1* | 4/2007 | Fukumitsu | B23K 26/0884 |
| | | | 257/98 |
| 2009/0298264 A1* | 12/2009 | Arai | H01L 21/6835 |
| | | | 438/464 |
| 2010/0203678 A1* | 8/2010 | Fukumitsu | B23K 26/0884 |
| | | | 438/113 |
| 2012/0077315 A1* | 3/2012 | Fukumitsu | B23K 26/0884 |
| | | | 438/114 |
| 2012/0286429 A1* | 11/2012 | Han | H01L 21/78 |
| | | | 257/774 |
| 2012/0329246 A1 | 12/2012 | Finn | |
| 2014/0291781 A1* | 10/2014 | Shaw | H01L 29/84 |
| | | | 257/415 |
| 2019/0164784 A1* | 5/2019 | Wongratanaporngoorn | |
| | | | H01L 21/568 |

* cited by examiner

LASER SCRIBING FROM BACK SIDE

DIE SEPARATION USING ADHESIVE-LAYER LASER SCRIBING

BACKGROUND

The present invention relates generally to techniques for manufacturing integrated circuit (IC) dies and, more particularly, to techniques for separating individual IC dies from multi-die wafers.

Multiple copies of an IC die are fabricated on a semiconductor (e.g., silicon) wafer. Individual dies are separated by mounting the wafer onto a substrate (such as a plastic dicing tape) using a layer of adhesive such as a die attach film (DAF) or film over wire (FOW) material, and then using a saw to cut along saw streets located between the dies. For thin IC dies, such blade dicing can result in backside chipping of the die.

To limit backside chipping, a dice-before-grind (DBG) technique can be employed to separate IC dies. In DBG, the separation occurs during a wafer-thinning step. In particular, a blade or laser beam is applied to the front side of the wafer to partially cut the wafer to a depth below the target thickness of the dies. A supporting "substrate" material such as back-grinding tape then is mounted on the front side of the wafer, and mechanical grinding is performed on the wafer backside to thin the wafer to the target thickness, thereby separating the individual dies. Dicing tape, DAF, or FOW is then applied to the backside of the wafer for the next process step, such as die pick-up.

Another alternative to blade dicing is stealth dicing (SD) in which defect regions are introduced into the wafer by scanning a laser beam along intended cut lines, and then the underlying substrate is expanded to induce fractures in the wafer along the cut lines, thereby separating the individual dies.

In both DBG and SD, following the separation of the wafer into individual dies, the separated dies are still mounted on the substrate by the adhesive layer. So that pick-and-place machinery can safely remove individual dies from the substrate, the adhesive layer must be separated such that each die is supported on the substrate by a corresponding portion of adhesive material that is separated from the portions of adhesive material corresponding to adjacent dies. A laser can be used to remove the adhesive material from between adjacent dies to form these separate adhesive portions, but any misalignment of the laser beam can result in damage to the dies. Accordingly, it would be advantageous to have a reliable and cost-effective method of separating dies formed on a wafer, and removing the dies from a carrier substrate, that avoids die backside chipping.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

According to certain embodiments of the present invention, the layer of adhesive material, such as DAF or FOW, used to mount a multi-die wafer on a substrate, such as a dicing tape, is scribed using a laser prior to a breaking step, such as a cool-expansion step, in order to create defects within the adhesive layer that weaken the otherwise contiguous adhesive material between adjacent dies such that the expansion step will separate the portions of the adhesive material underlying adjacent dies.

Figure 1A:
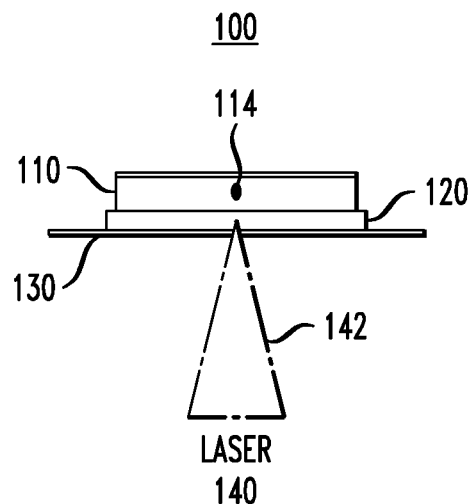
FIGS. 1A-1C are cross-sectional side views of a stealth-dicing (SD) technique for separating IC dies from a multi-die wafer, according to one embodiment of the present invention.
Figure 1B:
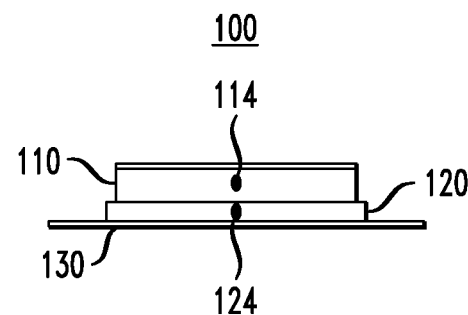
Figure 1C:
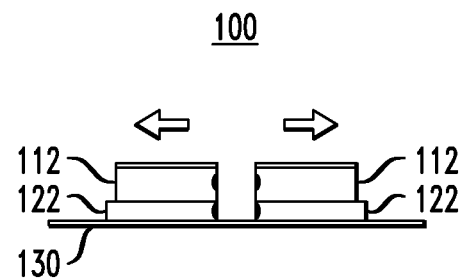

FIGS. 1A-1C are cross-sectional side views illustrating a stealth-dicing (SD) technique in accordance with an embodiment of the present invention. FIGS. 1A-1C show a wafer/adhesive/substrate assembly 100 that includes a wafer 110, a layer of adhesive material 120, and a substrate 130. The wafer 110 includes a plurality of ID dies 112 formed as an array as is known in the art, although the drawings are simplified views that show only two adjacent rows of the IC dies 112 in the wafer 110.

FIG. 1A is a cross-sectional side view of the wafer/adhesive/substrate assembly 100 in which the wafer 110 is mounted backside down on the substrate 130 (such as, but not limited to, dicing tape) using the layer 120 of adhesive material. The adhesive layer may comprise a die attach film (DAF) or film over wire (FOW) material. As represented in FIG. 1A, the wafer 110 has previously been subjected to a conventional SD laser scan to introduce defect regions 114 into the wafer 110. As also represented in FIG. 1A, a laser 140 is used to apply a laser beam 142 through the substrate 130 to scribe the adhesive layer 120 along the same wafer cut lines corresponding to the SD wafer-defect regions 114.

FIG. 1B is a cross-sectional side view of the wafer/adhesive/substrate assembly 100 after the laser scribing of the adhesive layer 120. As represented in FIG. 1B, in addition to the SD wafer-defect regions 114 in the wafer 110, there are corresponding laser-scribed defect regions 124 in the adhesive layer 120.

FIG. 1C is a cross-sectional side view of the wafer/adhesive/substrate assembly 100 following a conventional SD expansion step, such as a cool-expansion step, in which the substrate 130 is laterally expanded, as represented by the arrows in FIG. 1C, which, due to the presence of both the SD wafer-defect regions 114 in the wafer 110 and the laser-scribed defect regions 124 in the adhesive layer 120, simultaneously results in the wafer 110 being fractured into individual IC dies 112 and the adhesive layer 120 being separated into individual portions 122 of adhesive material underlying each IC die 112. Each IC die 112 can then be safely removed from the substrate 130 using, e.g., conventional pick-and-place machinery (not shown) for further assembly into a packaged IC chip (not shown) that can be used in an electronic product (not shown).

Figure 2A:
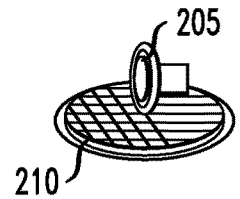
FIGS. 2A-2E are views of a dice-before-grind (DBG) technique for separating IC dies from a multi-die wafer, according to another embodiment of the present invention.
Figure 2B:
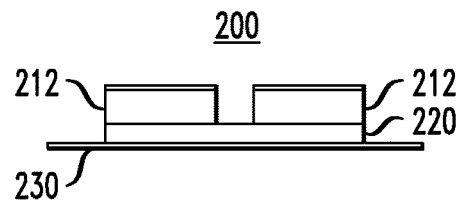
Figure 2C:
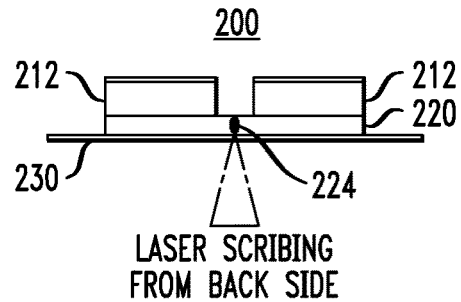
Figure 2D:
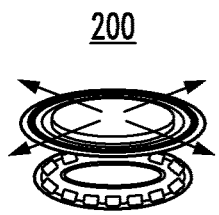
Figure 2E:
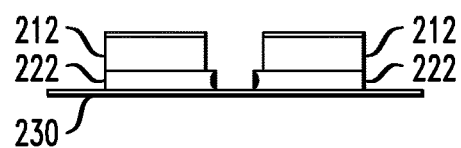

FIGS. 2A-2E illustrate a dice-before-grind (DBG) technique for separating IC dies from a multi-die wafer according to another embodiment of the present invention. A die/adhesive/substrate assembly 200 includes a multi-die wafer 210, a layer 220 of adhesive material, and a substrate 230. The wafer 210 includes a plurality of dies 212 arranged in an array, as is known in the art. Note that FIGS. 2B, 2C, and 2E represent simplified cross-sectional views corresponding to only two adjacent rows of the IC dies 212.

FIG. 2A is a perspective view of the wafer 210 being subjected to a partial-cutting step in which the wafer 210 is partially cut on its front side, in this case, using a blade 205. The partial-cutting step is performed along the saw streets to a depth that is greater than the thickness of the wafer 210. Note, as used herein, wafer front side means the side of the wafer with the exposed, active side of the dies.

FIG. 2B is a cross-sectional side view of the die/adhesive/substrate assembly 200 that results from the partially cut wafer 210 of FIG. 2A being mounted front-side down on the substrate 230 with the adhesive material layer 220. In one embodiment, the substrate 230 comprises a dicing tape, and the adhesive material layer 220 comprises DAF or FOW. After the partially cut wafer 210 is mounted on the substrate 230, the wafer 210 is thinned from the backside using a grinding step to separate the wafer 210 into the individual IC dies 212. More particularly, the backside of the wafer 210 is thinned to the depth of the front-side cut, which separates the dies 212 from adjacent dies 212. In alternative embodiments, the wafer 210 can be thinned using techniques other than mechanical grinding, such as (without limitation) chemical or plasma etching.

FIG. 2C is a cross-sectional side view of the die/adhesive/substrate assembly 200 of FIG. 2B being subjected to a laser-scribing step through the substrate 230 to create defect regions 224 in the adhesive layer 220 similar to the defect regions 124 of FIG. 1B.

FIG. 2D is a perspective view of the assembly 200 of FIG. 2C being subjected to a substrate-expansion step, similar to the SD substrate-expansion step of FIG. 1C, after the laser-scribing step. As in FIG. 1C, due to the presence of the laser-scribed defects 224 in the adhesive layer 220, the substrate-expansion step of FIG. 2D results in the adhesive layer 220 being separated into individual portions 222 of adhesive material underlying each IC die 212. Here, too, each IC die 212 can then be safely removed from the substrate 230 using, e.g., conventional pick-and-place machinery (not shown) for further assembly into a packaged IC chip (not shown) that can be used in any suitable electronic consumer product (not shown).

Although the invention has been described in the context of wafers that are separated into IC dies using either a stealth-dicing (SD) technique or a dice-before-grind (DBG) technique, the invention is not so limited. In general, the invention can be applied in the context of any suitable die-separation technique to separate an adhesive layer into separated portions of adhesive material underlying the separated IC dies. Other suitable die-separation techniques include, without limitation, laser grooving (LG) from the front side to remove only metal structure in the saw street before employing a DBG technique using an abrasive blade to make a die-separation cut.

Although the invention has been described in the context of techniques that use a substrate-expansion step to separate the laser-scribed adhesive layer into adhesive portions corresponding to the separated IC dies, other suitable breaking techniques can be used to separate the laser-scribed adhesive layer, such as, without limitation, using laser scribing to completely separate the adhesive layer, in which case, a substrate-expansion step is not necessary.

Note that, in the invention, the laser scribing of the adhesive layer does not itself dice the adhesive layer into separated adhesive portions. Rather, the laser scribing creates defect regions within an otherwise contiguous adhesive layer. It is only during the subsequent breaking step that the adhesive layer is separated into the adhesive portions due to the presence of those defect regions.

In addition to enabling die-separation techniques that reduce backside chipping, the present invention can reduce the scribe-line width for stealth dicing, thereby enabling manufacturing of more dies per wafer.

In certain embodiments, the present invention provides an IC die manufactured by mounting a multi-die wafer onto a substrate using an adhesive layer; laser scribing the adhesive layer to create defect regions in the adhesive layer; and performing a breaking step to separate the laser-scribed adhesive layer into a separate adhesive portion corresponding to the IC die. In at least some of the above embodiments, after the laser-scribing step, but prior to the breaking step, the adhesive layer has the defect regions, but is otherwise contiguous.

The breaking step may comprise a substrate-expansion step, and the substrate-expansion step may comprise a cool-expansion step. The mounting step may comprise creating wafer-defect regions in the wafer using a laser, and, during the breaking step, the wafer fractures along cut lines corresponding to the wafer-defect regions to separate the wafer into separate IC dies. The laser-scribed defect regions formed in the adhesive layer preferably correspond to the cut lines in the wafer.

In some embodiments, the wafer is mounted backside down onto the substrate. The creating step is a stealth-dicing defect-creating step, and the breaking step is a stealth-dicing substrate-expansion step. The mounting step comprises partially cutting the wafer, mounting the partially cut wafer onto the substrate, and grinding the backside of the partially cut wafer to separate the IC dies. The partial cutting is applied to the front side of the wafer, and the wafer is mounted front-side down onto the substrate. The thinning is applied to the backside of the wafer, and the mounting step is a DBG mounting step. The breaking step is a substrate-expansion step.

In at least some of the above embodiments, the laser-scribing step comprises laser scribing the adhesive layer through the substrate to create the defect regions in the adhesive layer.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A method for manufacturing integrated circuit (IC) dies, the method comprising:
   mounting a multi-die wafer onto a substrate using an adhesive layer;
   laser scanning the multi-die wafer to introduce defects into the wafer along lines located between die locations on the wafer;
   laser scribing the adhesive layer through the substrate to create defects in the adhesive layer along the lines; and
   performing a breaking step to separate the laser-scribed adhesive layer into separated adhesive portions corresponding to the IC dies, wherein:
      the wafer fractures along the lines corresponding to the defects in the wafer, thereby separating the multi-die wafer into the IC dies.

2. The method of claim 1, wherein the wafer is mounted backside down onto the substrate, and the adhesive layer secures the wafer backside to the substrate.

3. The method of claim 1, wherein, after the laser-scribing step, but before the breaking step, the adhesive layer has the defects, but is otherwise contiguous.

4. The method of claim 1, wherein the breaking step is a substrate-expansion step.

5. The method of claim 4, wherein the substrate-expansion step is a cool-expansion step.

6. The method of claim 1, wherein the laser-scribed defects in the adhesive layer correspond to the lines in the wafer.

7. The method of claim 1, wherein:
   the breaking step is a stealth-dicing substrate-expansion step.

8. The method of claim 1, wherein the mounting step comprises:
   partially cutting the wafer front side;
   mounting the partially cut wafer front side down onto the substrate; and
   thinning the backside of the partially cut wafer to separate the IC dies.

9. The method of claim 8, wherein:
   the mounting step is a dice-before-grind mounting step; and
   the breaking step is a substrate-expansion step.

10. A method of separating adjacent integrated circuit (IC) dies formed on a semiconductor wafer, the method comprising:
    laser scribing a backside of the wafer along lines located between adjacent ones of the IC dies to form defects in the wafer along the lines;
    mounting the laser-scribed wafer onto a substrate using an adhesive layer,
       wherein the wafer is mounted backside down onto the substrate, and
       the adhesive layer secures the wafer backside to the substrate;
    laser scribing the adhesive layer through the substrate to create defects in the adhesive layer along the lines; and
    performing a breaking step to separate the laser-scribed adhesive layer and the laser-scribed wafer along the lines into separate adhesive and wafer portions, thereby providing the separated IC dies.

11. The method of claim 10, wherein, after the adhesive layer laser-scribing step, but before the breaking step, the adhesive layer has the defects but is otherwise contiguous.

12. The method of claim 10, wherein the breaking step is a substrate-expansion step, and the substrate-expansion step is a cool-expansion step.

13. The method of claim 10, wherein:
    during the breaking step, the wafer fractures along the lines corresponding to the defects.

* * * * *